(12) United States Patent
Brown et al.

(10) Patent No.: US 7,001,853 B1
(45) Date of Patent: Feb. 21, 2006

(54) FLOW CONTROL OF PHOTO-POLYMERIZABLE RESIN

(75) Inventors: Timothy B. Brown, Gilroy, CA (US); Richard Kurth, Mountain View, CA (US)

(73) Assignee: Caliper Life Sciences, Inc., Mountain View, CA (US)

( * ) Notice: Subject to any disclaimer, the term of this patent is extended or adjusted under 35 U.S.C. 154(b) by 114 days.

(21) Appl. No.: 10/650,463

(22) Filed: Aug. 28, 2003

Related U.S. Application Data

(60) Provisional application No. 60/407,407, filed on Aug. 30, 2002.

(51) Int. Cl.
*H01L 21/31* (2006.01)
(52) U.S. Cl. ............... 438/780; 430/269; 430/311
(58) Field of Classification Search ........... 438/780; 430/269, 311
See application file for complete search history.

(56) References Cited

U.S. PATENT DOCUMENTS

| | | | |
|---|---|---|---|
| 5,089,111 A | 2/1992 | Zhu et al. | |
| 5,164,055 A | 11/1992 | Dubrow | |
| 5,304,487 A | 4/1994 | Wilding et al. | |
| 5,409,863 A | 4/1995 | Newman | |
| 5,545,302 A | 8/1996 | Zhu et al. | |
| 6,042,710 A | 3/2000 | Dubrow | |
| 6,084,311 A | 7/2000 | Jiang et al. | |
| 6,139,661 A | 10/2000 | Cronin et al. | |
| 6,284,438 B1 * | 9/2001 | Choi et al. | 430/322 |
| 2002/0012971 A1 | 1/2002 | Mehta | |

OTHER PUBLICATIONS

U.S. Appl. No. 09/993,914, Chien et al.

* cited by examiner

*Primary Examiner*—George Fourson
*Assistant Examiner*—Julio J. Maldonado
(74) *Attorney, Agent, or Firm*—Donald R. McKenna; Ann C. Petersen

(57) ABSTRACT

This invention provides methods and systems, e.g., to control the flow of photo-polymerizable resins. In the method, e.g., flow of a photo-polymerizable resin is restricted from illuminated resin exclusion regions on a substrate surface by precisely situated flow barriers. A system to control photo-polymerizable resin flow includes, e.g., a light source, a mask and a substrate.

12 Claims, 5 Drawing Sheets

FLOW CONTROL OF PHOTO-POLYMERIZABLE RESIN

CROSS-REFERENCE TO RELATED APPLICATIONS

This application claims the benefit of U.S. Provisional Patent Application No. 60/407,407, filed Aug. 30, 2002, which is incorporated herein by reference in its entirety for all purposes.

FIELD OF THE INVENTION

This invention is in the field of methods and systems to control the flow of photo-polymerizable resin. More specifically, the invention relates to methods and systems for limiting the flow of photo-polymerizable resin to precisely situate the resin in desired locations.

BACKGROUND OF THE INVENTION

Adhesives are generally applied as a liquid that eventually solidifies and binds to a surface. From ancient times, water based adhesives (glues) were extracted from plant or animal sources. These glues usually bound to surfaces, or bound two surfaces together, as they slowly dried. With the advent of plastics and other modern polymers, adhesives were created that solidify and bind surfaces through chain elongation chemistries (polymerization). Still, adhesives have tended to be applied and cured in an imprecise and wasteful manner.

Glues and adhesives can be applied to surfaces with some precision or generally smeared about the work piece. Adhesives can be applied imprecisely by brushing, dipping, pouring, and spraying if the adhesive is inexpensive and if excess can drain aside without harm. Where excess adhesive can damage the work piece, skilled application (e.g., intricate brush work) or high technology provides techniques for more precise application.

Flow dams can be established to limit the flow of adhesives. In U.S. Pat. No. 5,409,863, entitled "Method and Apparatus for Controlling Adhesive Spreading when Attaching an Integrated Circuit Die", for example, a solder mask ring barrier is screen printed around the periphery of a die mounting pad of an integrated circuit to prevent adhesive flow onto surrounding circuit electrical contacts. In another example, U.S. Pat. No. 6,084,311, entitled "Method and Apparatus for Reducing Resin Bleed During the Formation of a Semiconductor Device", the flow of adhesive is constrained within a low surface tension area by a surrounding high surface tension dam. The mounting position of a semiconductor chip on an electronic lead frame pad is covered with a low surface tension composition attractive to an adhesive, but surrounded with a high surface tension composition repellant to the adhesive. When the chip is mounted to the pad, the adhesive flows between the semiconductor and low surface tension region but tends not to flow onto the a high surface tension region or surrounding circuitry. In these technologies, precise adhesive application requires precise pre-application of the dam compositions.

Polymers can be precisely located by light directed polymerization (curing) of resins. For example, in U.S. Pat. No. 6,139,661, entitled "Two Step SMT Using Masked Cure", terminals of an integrated circuit are generally coated with an unpolymerized electrical conductive adhesive. Test electrode leads are temporarily bonded to specific terminals by placing the test lead into adhesive on the terminal followed by spot illumination of the terminal, through a mask. Adhesive at the test terminal is polymerized while adhesive at other terminals remains unpolymerized and available for later testing. Such spot curing techniques can provide precise bonding of adhesive but requires adhesives to be previously applied at the site. These spot curing techniques are not intended to prevent adhesives from migrating onto restricted surfaces. Adhesive applied, but not spot cured, remain as a wasteful messy residue.

A need remains for methods and equipment to precisely situate polymers without leaving residue on adjacent surfaces, or having to preprint dam boundaries. Spot curing methods that could precisely direct polymerization can benefit from techniques that do not require pre-application of the adhesive and exclude adhesive from surfaces sensitive to adhesive residues. The present invention provides these and other features that will become apparent upon review of the following.

SUMMARY OF THE INVENTION

Embodiments of the present invention provide methods and systems for controling the flow and precisely situating photo-polymerizable resins on the surface of a substrate. Methods in accordance with the invention can be used to bind patterned polymers onto a substrate, to bond microfluidic chips to reagent well caddies without clogging microchannels, and to bond optic fibers to articles of manufacture without obscuring the fiber end with adhesive.

Methods of controlling the resin flow in accordance with the invention can include the steps of illuminating regions of resin exclusion on a substrate, applying a photo-polymerizable resin to flow in dark regions on the substrate, and forming flow barriers by polymerization of resin at the illuminated interface between the resin exclusion regions and the dark regions, so that the resin can flow to fill the dark regions but is substantially restricted from flowing onto the resin exclusion regions. Fluid resin in the dark regions can be finally cured, for example, by exposing it to heat or light. In embodiments where a substrate is transparent (such as quartz glass to UV light), light can be directed onto the photo-polymerizable resin through the substrate to initiate the final cure.

The resin exclusion regions of the substrate surface can be illuminated by any technique in the art that provides the desired precision and intensity. For example, illuminated regions of resin exclusion can be defined by scanning the substrate surface with a laser light. Light from a conventional light source, a UV light source, or a laser light can be directed onto the substrate past refraction critical angle perturbations, through transparent portions, or around edges of a mask to precisely illuminate regions of resin exclusion.

A variety of different mask configurations are compatible with embodiments of the invention. For example, a mask used to prevent illumination from reaching portions of a substrate can be a substantially opaque object comprising edges or opaque portions that can cast a shadow to adequately define dark regions of resin flow on the substrate. In embodiments related to microfluidic devices, a mask can be a microfluidic reagent well caddie on a microfluidic chip substrate, wherein resin can flow in the dark regions between the caddie and chip, but not into the illuminated reagent wells (transparent portions) of the caddie. In embodiments related to microfluidic devices comprising one or more sipper tubes, the mask can be an opaque coating on a capillary sipper tube so adhesive resin can bind to the coating without flowing to block the illuminated tube end as it is mounted onto a microfluidic chip. In embodiments related to semiconductor packaging, the mask can be a semiconductor chip on a electronic lead frame pad, wherein adhesive resin flows between the chip and pad, but is restricted from flowing out from under the chip to where it can contaminate electrical leads. In embodiments relating to fiber optics, the mask can be an opaque cladding on an optic fiber so that adhesive resin can bind the fiber but will not contaminate the illuminated fiber end as it is mounted onto an optical amplifier. Optionally, in some embodiments the mask can be a surface with a critical angle greater than the angle of illumination but allowing illumination of a substrate through lower critical angle perturbations on the mask surface.

A photo-polymerizable resin is a fluid that can solidify on exposure to light. Typically, resins in the methods of the invention flow as a liquid, seeking the lowest level in the structure containing them. For example, resins confined within a series of barriers on a horizontal substrate will flow to form a smooth level surface. Resins in accordance with the invention can flow by capillary action in any direction that the forces of surface tension and surface adhesion will carry them. Resin flow, in embodiments of this invention, can be precisely controlled by polymerized resin barriers formed at interfaces between dark and light surfaces.

Photo-polymerizable resins in accordance with the invention can be electrically conductive. Precisely situated electrically conductive resins can act as part of an electric circuit. So in some embodiments, the resins can provide the ground connection for a semiconductor chip, as they also provide the adhesive bond between the chip and the circuit board. Electrically conductive resins can be laid out as extended circuit elements to provide electrical communication between semiconductors on a circuit board.

A resin flow control system in accordance with the invention can be an arrangement of a light source, mask, and substrate that defines illuminated resin exclusion regions where photo-polymerizable resin will not flow. A resin flow control system can include a mask positioned between a substrate and a light source that defines illuminated regions and dark regions on the surface of the substrate. A photo-polymerizable resin can flow on the substrate surface in the dark regions, but is substantially excluded from the substrate surface in the illuminated regions.

The mask in a system in accordance with the invention can be an object that casts a useful shadow pattern of resin flow restriction onto a substrate. A microfluidic reagent well caddie can be a mask that allows illumination of reagent well bottom surfaces to prevent flow of resin into microchannel inlet ports. A mask can be in close association with the substrate and have an affinity for the resin so that the resin can flow between the mask and the substrate by capillary action to bond the mask to the substrate. A semiconductor chip can function as a mask that allows illumination around the edges to prevent flow of adhesive resin beyond the base of the chip. An opaque cladding on an optic fiber or capillary tube can function as a mask that allows illumination of the ends so the sides can be bound to equipment without adhesive blocking light or fluid flow at the tip. The mask of the system can be provided as a reflective/refractive surface having a pattern of refraction critical angle perturbations (such as regions of higher or lower critical angles) that can reflect light away from adhesive flow regions and/or refract light onto resin exclusion regions; those skilled in the art can appreciate that a reflective/refractive mask can reflect light onto resin exclusion regions and/or refract light away from adhesive flow regions.

The substrate of a system in accordance with the invention can be an object with a surface where photo-polymerizable resins of the invention will flow. For example, the substrate can be the top surface of a microfluidic chip where reagent wells are precisely bonded or the bottom surface where capillary sip tubes are precisely bonded. To bond the reagent wells to the microfluidic chip, the well caddie can be closely positioned under the horizontal chip surface and flow of resin into the wells can be prevented with illumination from below. The illuminated substrate can be the end surfaces of clad capillary tubes or optic fibers, while the dark regions of the substrate can be the closely associated surfaces of the receiving article of manufacture.

The light source of the invention can be any source of illumination adapted to the particular mask and photo-polymerizable resin of the system. For example, where the mask contacts a UV sensitive, heat curable photo-polymerizable resin, an IR filtered UV light source can be used to illuminate resin exclusion regions. The intensity of illumination can be adjustable by changing the path length between the light source and the substrate, changing the diameter of a mechanical aperture in the light path, and/or changing a power supplied to the light source. A shutter can be provided between the light source and the substrate to completely block illumination for safety and process control. Mirrors can reflect light between the light source and the substrate to redirect the angle of illumination and/or to share a single light source between work pieces. The mirror can have glass or surface coatings that do not reflect infrared light so that heat is not transferred from the lamp to the work piece.

The resin of the system can be a photo-polymerizable resin compatible with the particular substrate and process. For example, if the resin is expected to adhere well, or flow by capillary action, the resin can have an affinity for the substrate. If the process includes a heat treatment final cure, the resin can include a heat sensitive initiator of polymerization.

DETAILED DESCRIPTION

Figure 1A:
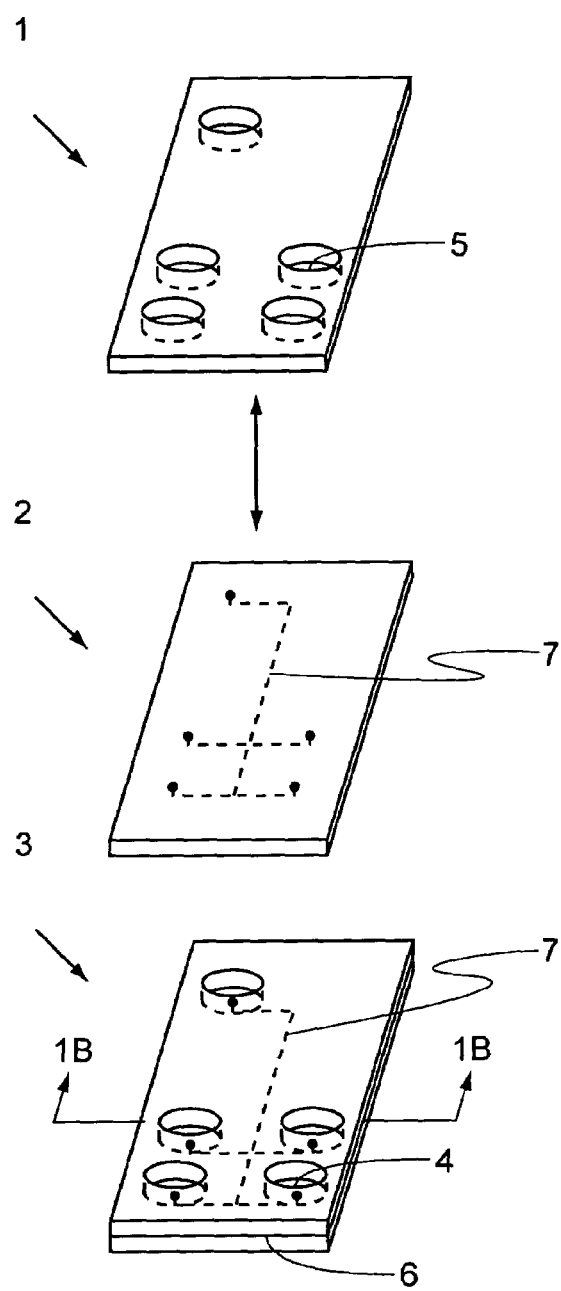
FIG. 1 is a schematic diagram of a microfluidic device in which a microfluidic chip acts as a substrate and a reagent well caddie acts as a mask during assembly.

Embodiments of the present invention provide methods to control the flow of photo-polymerizable resin on a substrate. These methods can include the steps of precisely illuminating resin exclusion regions of a substrate and flowing photo-polymerizable resin onto the substrate, whereby polymerized resin flow barriers are created at the periphery of illuminated regions. The systems of the invention include a source of light, a mask, a substrate and a photo-polymerizable resin.

In an aspect of the invention, a substrate is illuminated through a mask to form a precise pattern of illuminated regions and dark regions. Photo-polymerizable resin can be applied to fill dark regions of the substrate and to flow to the edges of illuminated resin exclusion regions. Polymerization is initiated as the leading edge of the flowing resin is exposed to light at the interface between the resin exclusion and dark regions. The leading edge is a viscous polymerized barrier that substantially prevents flow of resin onto the illuminated resin exclusion region of the substrate. Resin on the dark regions can fill in behind the barriers to replicate the mask pattern on the substrate surface.

In another aspect, systems in accordance with the invention include a source of light, a perforated mask, a substrate and a photo-polymerizable resin. In operation, the light source illuminates the substrate through transparent portions in the mask to create illuminated resin exclusion regions on the substrate surface. The resin can be applied so that it flows freely on dark regions of the substrate surface while it is substantially restricted from flow onto illuminated resin exclusion regions.

Methods of Patterning Resin Flow

In resin patterning methods in accordance with the invention, a photo-polymerizable resin can be substantially prevented from flowing into illuminated regions of a substrate surface. The illuminated regions can be, for example, established by directing light through transparent portions in a mask from a light source. By preventing the flow of resin to portions of a substrate, methods in accordance with the invention can be used to form a patterned polymer layer on a substrate. In some embodiments, methods in accordance with the invention can bind a substrate (such as a microfluidic chip or a semi conductor circuit base) to a mask (such as a microfluidic chip well caddie or a semiconductor chip) without adhesive contamination of restricted surfaces. Other embodiments of methods in accordance with the invention can bind capillary tubes and/or optical fibers to articles of manufacture while excluding adhesive from tube end surfaces.

Photo-Polymerizable Resins

Resins compatible with embodiments of the invention can include any of the wide variety of photo-polymerizable resins known in the art. Many of these resins are polymerized by free radical chemistries initiated by exposure of photosensitive monomers, or photosensitive dye additives, to particular frequencies of light. For example, monomers polymerizable via free-radical chemistries include acrylate, methacrylate and/or vinyl ester functionalized resins. Other examples of monomers and/or oligomers that can be polymerized in embodiments of the invention include acrylates, methacrylates, methacrylamides, acrylamides, vinyl pyrrolidone, and azalactones. Such monomers can include mono-, di-, or poly-acrylates and methacrylates such as methyl acrylate, methyl methacrylate, ethyl acrylate, isopropyl methacrylate, isooctyl acrylate, allyl acrylate, isobornyl acrylate, isobornyl methacrylate, acrylic acid, n-hexyl acrylate, stearyl acrylate, glycerol diacrylate, glycerol triacrylate, ethylene glycol diacrylate, diethyleneglycol diacrylate, triethyleneglycol dimethacrylate, 1,6-hexanediol diacrylate, 1,3-propanediol diacrylate, 1,3-propanediol dimethacrylate, trimethanol triacrylate, 1,2,4-butanetriol trimethylacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyl-dimethylmethane, bis[1-(3-acryloxy-2-hydroxy)]-propoxyphenyl dimethylmethane, tris-hydroxyethyl isocyanurate trimethacrylate; the bis-acrylates and bis-methacrylates of polyethylene glycols of molecular weight 200–500, copolymerizable mixtures of acrylated monomers, acrylated oligomers, PEG diacrylates, and the like. Strongly polar monomers such as acrylic acid, acrylamide, itaconic acid, hydroxyalkyl acrylates, or substituted acrylamides, or moderately polar monomers such as N-vinyl-2-pyrrolidone, N-vinyl caprolactam, and acrylonitrile can be incorporated into useful photo-polymerizable resins in accordance with the invention. Mixtures of many of the above un-polymerized resins can provide useful copolymers in the methods of the invention.

Free radical polymerization is a chain reaction that can covalently bond one resin monomer to many others in a series or network of monomer links. For example, a free radical can initiate polymerization, by reacting with a monomer to form a covalent bond. The unpaired electron from the radical can be passed on to the monomer that, itself, becomes a radical. The radicalized monomer can react with another monomer to form a radical dimer. The radical dimer can attack another monomer to form a radical trimer, and so on. Propagation of this covalent bonding chain reaction can continue until it is terminated, for example, by the pairing of the unpaired electrons from two radicals.

Resins not normally polymerized by exposure to light can be photosensitized by incorporation of certain dyes. Photosensitive dyes can be activated by exposure to particular frequencies of light to release free radicals that can initiate polymerization. Dye-sensitized polymerization is well known in the chemical literature. For example, light from an argon ion laser (514 nm), in the presence of a xanthin dye and an electron donor, such as triethanolamine, can initiate free radical polymerization of acrylic groups in a reaction mixture (Neckers, et al., (1989) Polym. Materials Sci. Eng., 60:15; Fouassier, et al., (1991) Makromol. Chem., 192: 245–260). After absorbing laser light, the dye is excited to a triplet state that can react with a tertiary amine, such as triethanolamine, to produce a free radical that can initiate a polymerization reaction. There are a number of photosensitive dyes useful in initiation of polymerization, such as ethyl eosin, eosin Y, 2-methoxy,2-phenylacetophenone, fluorescein, 2,2-dimethoxy-2-phenyl acetophenone, camphorquinone, rose bengal, methylene blue, erythrosin, phloxime, thionine, riboflavin, methylene green, acridine orange, xanthine dye, thioxanthine dyes, and the like. Dyes can be chosen with specific photosensitive frequencies and solubilities to suit the selected resin flow control method and/or system.

Photo-polymerizable resins of the invention can polymerize quickly enough to avoid substantial flow onto a resin exclusion surface. Factors controlling polymerization rates are generally known in the art. For example, the rate of polymerization can be influenced by the intensity of the light, the resin temperature, the amount of photosensitive dye present, the presence and/or concentration of termination agents, and the type of resin employed.

Curing of photo-polymerizable resins can continue after illumination ends. For example, radicals generated under illumination of photosensitive dyes at the initiation phase of polymerization can continue to propagate chain extensions even after illumination has ended. Such radicals can diffuse to regions of resin not exposed to light, thus promoting curing of resin in dark regions of the substrate surface. In another example, monomers and/or heat sensitive initiator additives in the resin can generate radicals on exposure to heat. Radical generation by heat can complete polymerization of resin in dark regions after flow has been precisely limited by illumination.

Substrates and Resin Flow

Substrates compatible with embodiments of the invention include any surface onto which photo-polymerizable resins will flow. The substrate can be any shape adaptable to suitable resin flow and illumination. For example, a substrate of the invention can be an integrated circuit pad, the end of an optical fiber, or a microfluidic chip.

Substrates of the invention optionally include flat horizontal surfaces. Such substrates provide surfaces adapted to uniform distribution of liquid resins by gravitational flow. A liquid photo-polymerizable resin can be applied to dark regions of a flat substrate to flow out to an illumination interface between a dark region and an illuminated region where it can become a polymerized flow barrier. Un-polymerized resin can continue flowing in the dark regions to create a resin surface of uniform height surrounded by a series of uniform barriers at the illumination interfaces. If a substrate slopes, resin can intrude further into the upper side of an illuminated region, intrude less far into the lower side of an illuminated region, generate high barriers at the lower regions of the substrate, and/or fail to flow into elevated regions of the substrate, as desired.

In some embodiments, resin can flow onto a substrate by capillary action or "wicking". Capillary action is a combination of resin surface tension and resin adhesion to substrate surfaces that can allow it to flow up an incline. For example, if a substrate is closely overlaid with an overlay surface, and the resin molecules have a high affinity for the substrate and overlay surface, resin can fill the space between the substrate and overlay surface by capillary action even if the space is above the point of resin application. Substrates and overlay surfaces useful in distributing resin by capillary action can have a mutual affinity for resin molecules. For example, a hydrophobic resin can adhere to a hydrophobic surface through the force of hydrophobic interaction. If the resin has significant hydrophobic interactions with both the substrate and an overlay surface, the resin can be drawn into the space between them. Those skilled in the art can appreciate how repellant interactions, such as the combination of a polar substrate surface and hydrophobic resin, can be used to limit resin flow onto certain substrate surfaces in the invention.

In some embodiments, an overlay surface can optionally act as a mask. In such a case the mask can be substantially opaque and have a surface affinity for the resin of choice. The mask can have edges or transparent portions to define illumination interfaces between illumination regions and dark regions on the substrate surface. The transparent portions may comprise perforations in the overlay surface.

Light Sources

Light sources of the invention can provide light to illuminated regions at a frequency that can initiate polymerization by generating radicals in photo-polymerizable resins of the invention. Light sources compatible with embodiments of the invention include combinations of lamps, filters, mirrors, shutters, and other optical elements to adjust light and direct the light onto a mask and substrate. The light source can be a laser.

Light sources can be adjusted to provide an appropriate frequency and intensity of light for a particular polymerization task. For example, high frequency light, such as blue to UV light, can be provided by a mercury vapor lamp; while lower frequency light, such as yellow to IR light, can be provided by a tungsten filament lamp. Specific frequencies of light can be selected from the spectrum of a lamp by using optical elements such as light filters, prisms, or diffraction gratings. The intensity of the light can be adjusted by, for example, changing the power input to the lamp, changing the size of a mechanical output aperture, and/or changing the length of the light path between the lamp and the resin. In an illustrative embodiment, photosensitive xanthin dyes in a resin can be excited by 514 nm light from a tungsten lamp after absorption of heat by a IR filter, setting the light intensity by adjusting power to the lamp, and selection of 514 nm light with a diffraction grating.

Light can be directed to the resin through optical elements known in the art, such as apertures, shutters, mirrors and lenses. So, for example, light from a lamp can be initially directed using a parabolic mirror to reflect much of the lamp output to the resin. A mechanical aperture can be positioned in the light path to control the angle of dispersion and power of the light. A mechanical shutter can be positioned in the light path to block the light as a safety device to protect technicians from bright light or UV radiation while handling work pieces. The light path can change direction by reflection from one or more a mirrors, for example, to change the angle of substrate illumination, provide a long light path in a small box, or to redirect the light to one work piece while another is being handled. One or more lens can be placed in the light path, for example, to focus light for spot curing resin in a particular region, or to disperse a narrow beam of light for general illumination of an entire work piece.

The light frequency used in an embodiment of the invention will often influence the choice of materials for the optical elements. For example, in embodiments involving UV light, borosilicate glass is generally not an appropriate material for optical elements intended to transmit the UV light. Quartz glass, which transmits UV light, can be used instead. In embodiments where heat curing of a resin by IR light is desirable, chalocogenide glass can transmit infrared frequencies to the work piece with less absorption than many other types of glass.

In some embodiments of the invention, the light source can be a laser. Just as in embodiments employing conventional light sources, a mask can be positioned between a laser light source and a substrate to define a desired pattern on illuminated regions on the substrate surface. Optionally, a laser light beam can be scanned across a substrate surface to provide a pattern of illuminated regions without the need for a mask. Such laser scanning systems are well known in the art, and can include direction of laser beams by computer controlled motor actuated mirrors, and the like.

Masks

Masks in accordance with the invention can be any object that can be placed in the light path between a substrate and a light source to cast a shadow on the substrate. Masks of the invention can cast a shadow that provides an illumination interface on a substrate between an illuminated region and a dark region. A mask can be a sheet of opaque material containing a pattern of transparent portions, an opaque object that defines an edge pattern, and the like. The transparent portions of the mask may include perforations in the mask. A mask in accordance with the invention can be a surface with perturbations in refractive index that can direct reflected or refracted light to a substrate in a pattern of resin exclusion and/or flow regions. In some embodiments, a mask in accordance the invention is part of an article of manufacture that is intended to be precisely attached to a substrate with photo-polymerizable resin.

Figure 1B:
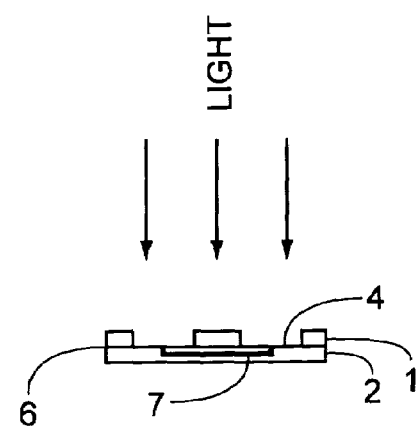

In one aspect, a mask in accordance with the invention can provide transparent portions that define illuminated resin exclusion regions on a substrate. For example, a microfluidic reagent well caddie can be used as a mask in embodiments of the invention. In the embodiment in FIG. 1A, opaque well caddie 1 can mated with microfluidic chip 2 to create microfluidic device 3. UV light can be directed down onto microfluidic device 3, as shown in FIG. 1B, so that reagent well surfaces 4 of microfluidic chip 2 (substrate) are illuminated through well perforations 5 but other surfaces are dark regions in the shadow of opaque well caddie 1 (mask). Photo-polymerizable resin can be applied to space 6 where it can flow by capillary action in the shadow of the reagent well caddie. Resin overflow onto portions of the microfluidic chip 2 underlying well perforations 5 is prevented by formation of barriers where resin is illuminated through the well perforations 5. In this embodiment of the invention the well caddie (mask) and microfluidic chip (substrate) can be bound together with the resin, while providing a flow path that is unimpeded by the resin through the well perforations to the microchannels 7 in the chip.

In other embodiments, the mask could be a sheet of opaque material patterned as an electrical circuit layout. Such a mask could have, for example, transparent portions to allow illumination of non conductive surfaces on a substrate and patterned opaque material to cast shadows along desired conductive paths. An electrically conductive photo-polymerizable resin could be applied to dark regions to flow and fill the conductive paths. Embodiments employing such a mask can provide electrical connections between integrated circuits.

In other embodiments of the invention, the mask can be a substantially opaque object that casts a shadow with edges (as compared to transparent portions) that define dark regions and illumination interfaces. In such a case, the shape of illuminated regions can be defined by light directed around edges of the mask. For example, in the manufacture of electronic and computer devices, solid-state electronic chips are often bound with an adhesive to a pad on an electronic lead frame. Attempts to establish electrical connections between the electronic chip and the leads can fail if bonding adhesive spreads beyond the pad to contaminate the leads. This problem can be reduced if photo-polymerizable resin is applied to the pad (substrate), in the shadow of the electronic chip (mask) so that flow of resin beyond the edge of the chip is limited by illumination from a light source.

In another aspect of the invention, optic fibers can be bound to surfaces using photo-polymerizable resins. Optic fibers with substantially opaque cladding, which can function as a mask, can be joined to a surface (substrate) by abutting the end of the fiber to the surface, transmitting light down the shaft of the fiber, and applying photo-polymerizable resin to the outside contact perimeter of the fiber and the surface. In this embodiment, the resin can surround the contact perimeter but cannot flow substantially into the space between the surface and fiber tip because of the light being transmitted through the fiber. After the resin has flowed onto bonding surfaces, the resin can be cured with light or heat, as described in the "Final Curing" section below. Optic fibers, as described herein, can include digital communication optic fibers, sipper capillary tubes of microfluidic devices, and the like.

Figure 2:
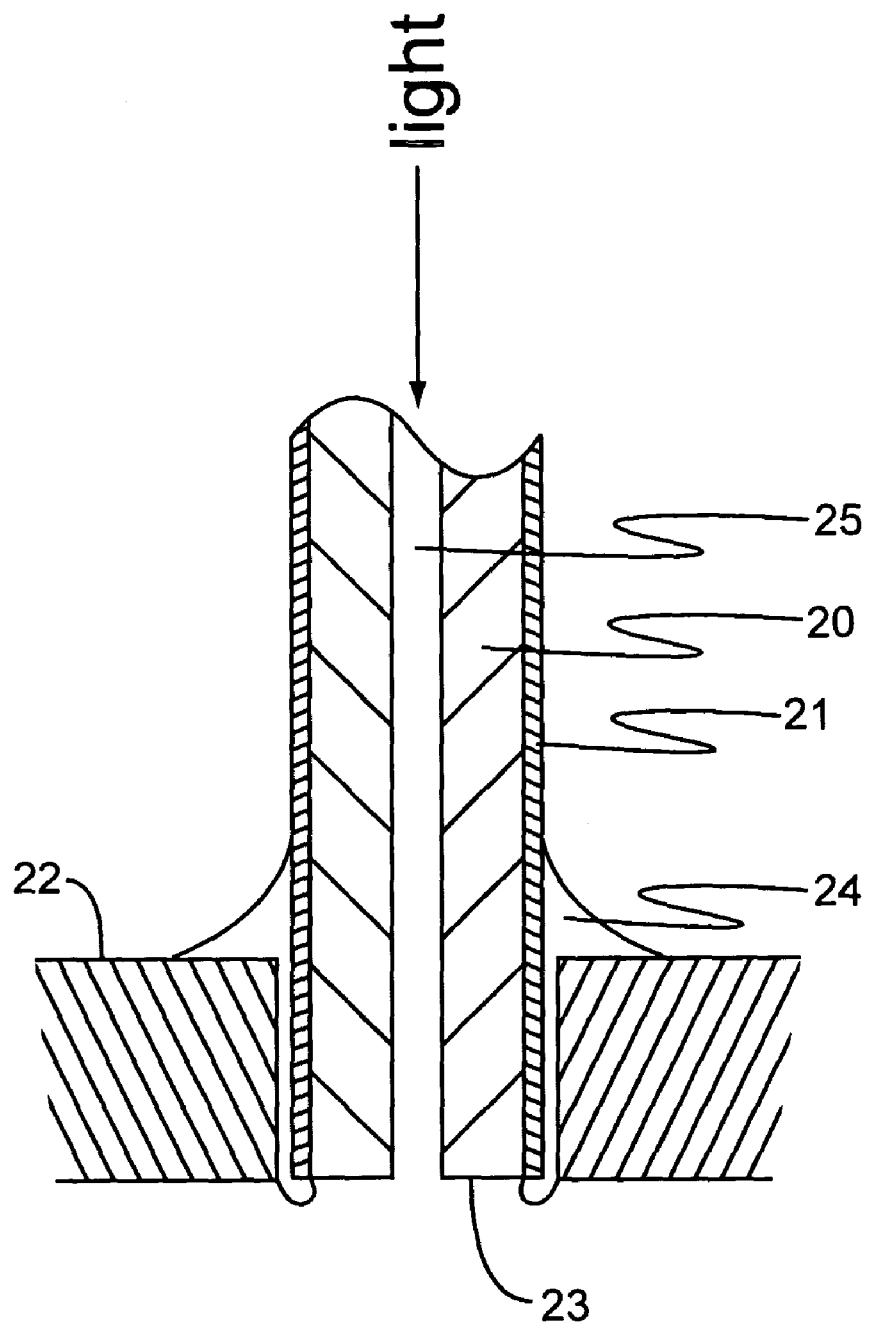
FIG. 2 is a schematic diagram of capillary tube bonding showing cladding acting as a mask and the tube end surface acting as an illuminated substrate.

Optic fibers can be bound within a perforation in an article of manufacture by inserting the fiber into the perforation, transmitting light through the shaft of the fiber, and applying a photo-polymerizable resin to the space between the fiber and the perforation. For example, as shown in FIG. 2, transparent sipper capillary tube 20 coated with opaque cladding (mask) 21 is inserted into a close fitting perforation of microfluidic chip 22. Light is transmitted down transparent capillary tube 20 to end surface (illuminated region) 23. Photo-polymerizable resin 24 is applied to the fill the space between cladding 21 and the microfluidic chip 22 by gravity flow and capillary action. The photo-polymerizable resin is illuminated as it rounds cladding 21 at the tip of the tube, thus preventing substantial intrusion of resin onto tube end surface 23 and preventing blockage of tube lumen 25. Bonding resin is then cured with light or heat, as described in the "Final Curing" section, below.

In some embodiments of the invention, the masks can include reflective/refractive surfaces that can define a pattern of resin flow exclusion. For example, light directed to a surface at an angle less than the critical angle for refraction will be reflected away from the surface. A perturbation on the surface, such as a lower refractive index material, a groove, a rise, and/or the like, can allow the light to enter the surface by refraction. Dark regions can be generated on a substrate beyond the surface where the light is reflected away from the substrate. Illuminated resin flow exclusion regions can be generated on a substrate beyond the surface where light is refracted onto the substrate. It can be appreciated by those skilled in the art that a pattern of illuminated resin exclusion regions and dark regions can be generated above a reflective/refractive surface in a similar fashion.

Final Curing

In many cases, significant amounts of photo-polymerizable resin remain un-polymerized in the dark region of a substrate surface after resin has been excluded by barriers from illuminated regions of the substrate. This precisely situated resin in dark regions can be cured by diffusion of radicals from the illuminated barrier resin, heat treatment, and/or light treatment.

As described in the "Photo-Polymerizable Resins" section, above, the polymerization chain reaction can continue until termination by exhaustion of un-polymerized resin or by pairing of unpaired radical electrons. Once polymerization is initiated by illumination of the resin at an illumination interface, radicals can diffuse and spread the polymerization chain reaction to resin in the dark regions. This method of final curing can be particularly effective where the ratio of illumination interface length to dark region area is high.

General illumination of substrates can be used to complete polymerization of un-polymerized resin in dark regions. After resin has been precisely situated within the boundaries of the polymerized barriers, the mask can be removed so that light can generally illuminate un-polymerized resin previously situated in the dark regions. Polymerization of the dark region resin can stabilize the resin pattern defined by the mask. Optionally, in cases where the substrate is transparent light can be directed from behind the substrate to cure the un-polymerized resin.

In addition to photosensitive initiation factors in the photo-polymerizable resin of the invention, the resin can contain heat sensitive initiators, such as peroxides or azonitriles. A resin that is both photosensitive and heat sensitive allows heat curing of residual un-polymerized resin in the work piece after the resin has been precisely situated by exclusion from illuminated regions. This final heat cure step can solidify resin in the dark regions to stabilize the polymer pattern and/or to strengthen bonding between a substrate and overlay surface.

Resin Flow Control Systems

The resin flow control system in embodiments of the invention can include, for example, a mask positioned between a light source and a substrate to form illuminated regions and dark regions on the substrate surface. A photo-polymerizable resin can be applied to the substrate and restricted from flow within illuminated regions by a build up of polymerized resin barriers at illumination interfaces.

Resin control systems in accordance with the invention can be configured in any of a wide variety of formats to practice the methods of the invention. Masks can be components of articles of manufacture or templates determining the layout of a complex patterned polymer. In illustrative embodiments, the light source can be an incandescent lamp or a laser, and include a control device with subsystems to adjust light direction and intensity. The substrate can be an inert surface for deposit of a specialty polymer, or a high tech microfluidic or electronic device. The resin of the system can be a simple adhesive or a conductive material for electronic circuitry.

Figure 3:
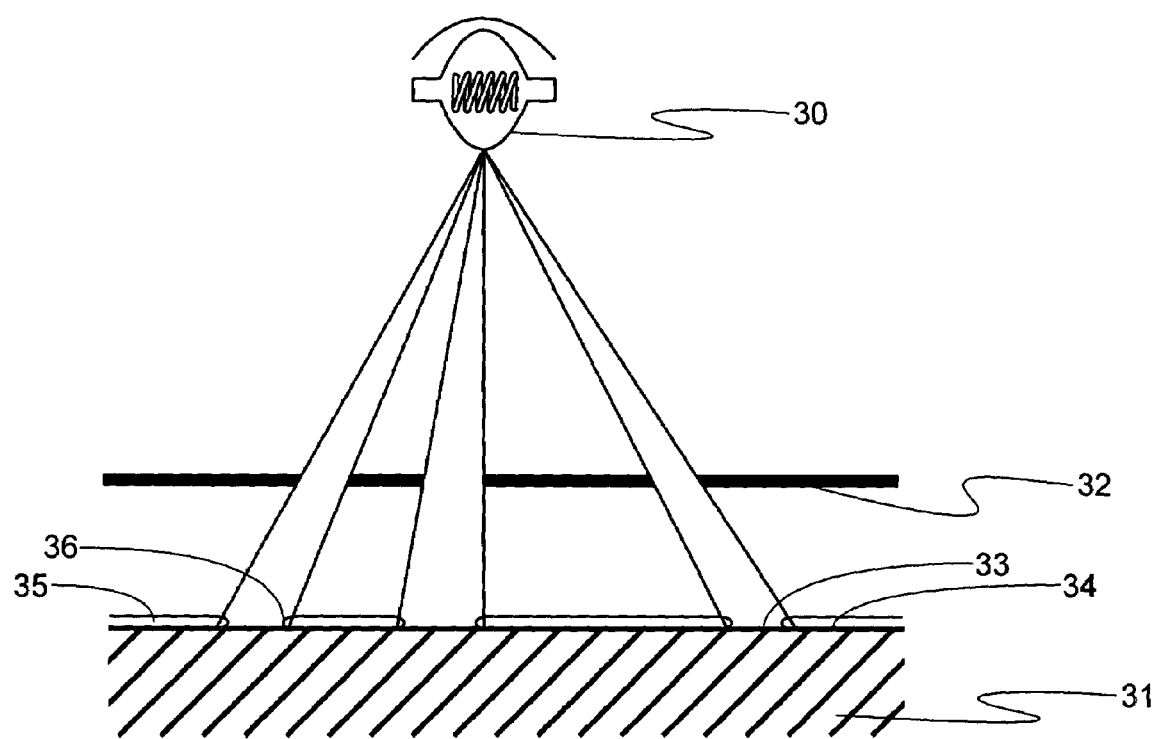
FIG. 3 is a schematic diagram of a resin flow control system in accordance with the invention wherein resin is precisely situated onto a substrate.

In a basic form, for example, embodiments of systems in accordance with the invention can include a mask positioned between a light source and a substrate. A photo-polymerizable resin can be applied to flow across the surface of the substrate. For example, as shown in FIG. 3, light source 30 illuminates substrate 31 through perforations in mask 32 to define illuminated regions 33 and dark regions 34 on the substrate surface. Photo-polymerizable resin 35, applied to dark regions 34, can be excluded from illuminated regions 33 by polymerization of resin to form barriers at illumination interfaces 36. In this embodiment, a conductive polymer can be laid out as electric circuits bound to a substrate.

Figure 4:
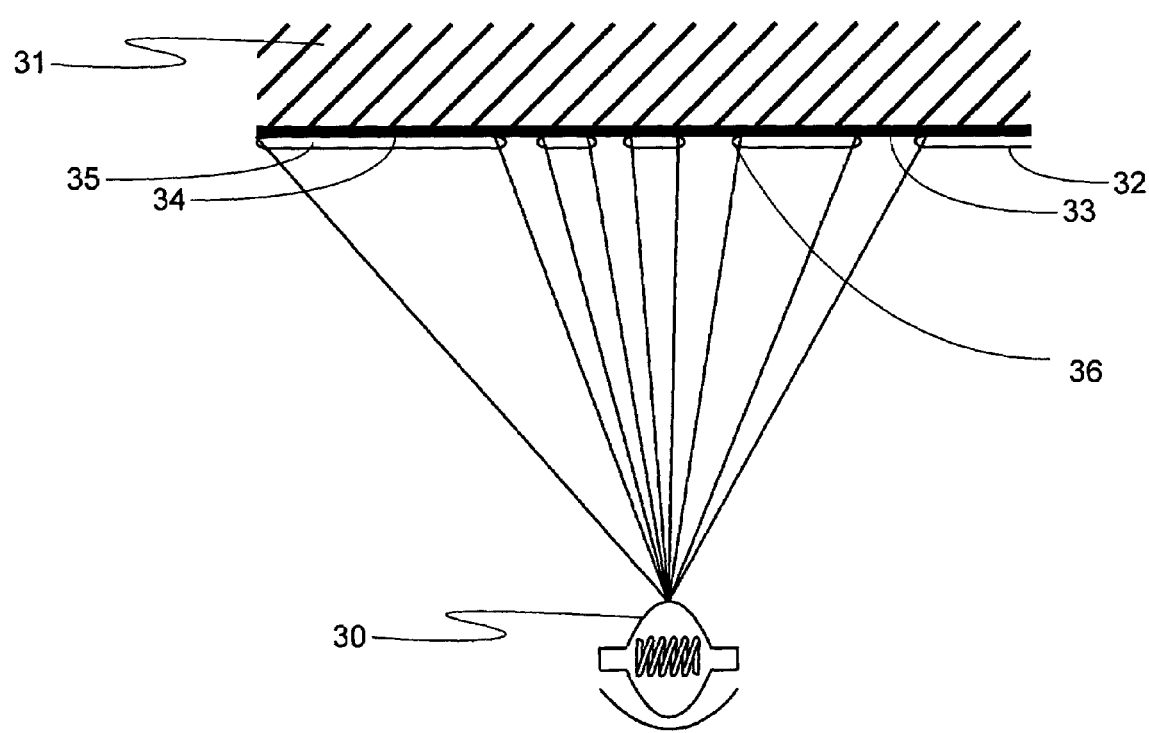
FIG. 4 is a schematic diagram of a resin flow control system in accordance with the invention showing resin being situated to precisely bind a mask to a substrate.

In other embodiments of systems in accordance with the invention, a mask can be closely associated with a substrate so that resin can flow between them by capillary action. Barriers at illumination interfaces can prevent resin overflow from dark regions near the point of resin application, allowing time for resin to flow out to regions further from the point of resin application. As shown in FIG. 4, for example, light source 30 can illuminate substrate 31 through perforations in mask 32 to define illuminated regions 33 and dark regions 34 on the substrate surface. Photo-polymerizable resin 35, can be applied to dark regions to flow by capillary action into the space between the mask 32 and substrate 31. Polymerized resin barriers at illumination interfaces 36 prevent resin intrusion into illuminated regions or dripping from the work piece. In this embodiment, a microfluidic reagent well caddie can be precisely fused to a microfluidic chip without accidental occlusion of illuminated micro channel ports with resin.

Figure 5:
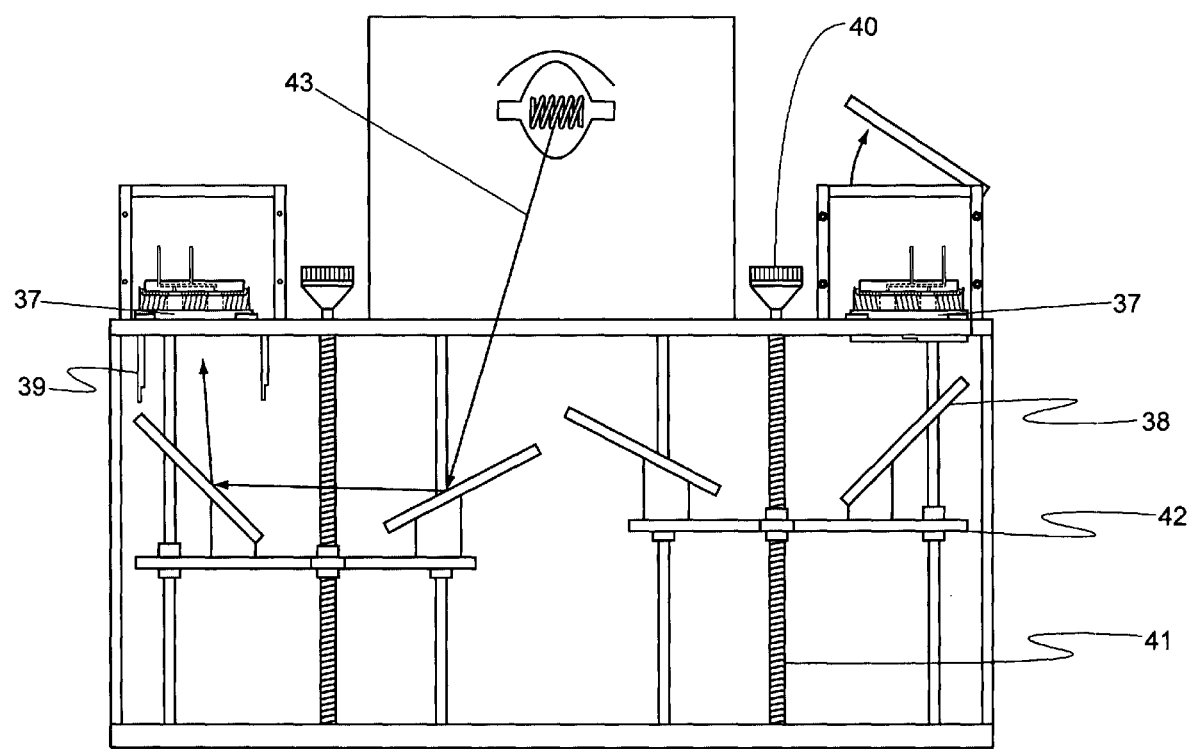
FIG. 5 is a schematic diagram of a resin flow control system employing optional control and efficiency elements.

Many design features can be included in the system of the invention to enhance the control and efficiency of resin flow control processes. Light source 30 can be shared between multiple illumination stages 37, as shown in FIG. 5, so that one work piece can be handled by a technician while resin on another work piece is curing. In embodiments such as that shown in FIG. 5, infrared (IR) light absorbing mirrors 38 can remove heat from the light to prevent heating of the work piece. The mirrors can redirect light to illuminate the work piece from any desired direction. Shutters 39 can be provided in the system to protect the technician from bright light or UV light hazards whenever illumination stages 37 are opened. Light intensity adjustment mechanisms can be provided to accommodate the photosensitivity of various resins or changes in lamp intensity with age. For example, adjustment knobs 40 on turnscrews 41 can adjust the height of mirror frames 42, changing the length of light path 43 and the light intensity at illumination stage 37.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of controlling the flow of resin, the method comprising:
    illuminating one or more resin exclusion regions on a substrate;
    applying a photo-polymerizable resin to one or more dark regions of the substrate, whereon the resin flows; and,
    polymerizing the resin at one or more illumination interface between the resin exclusion regions and the dark regions, thereby forming one or more barriers;
    whereby the resin flows onto one or more dark regions, and is substantially restricted from flowing onto the resin exclusion regions of the substrate.

2. The method of claim 1, wherein illuminating comprises directing laser light onto the substrate.

3. The method of claim 1, wherein illuminating comprises directing light onto the substrate through transparent portions or around edges of a mask.

4. The method of claim 1, wherein illuminating comprises directing light onto the substrate by reflection or refraction from a surface.

5. The method of claim 3, wherein the light comprises UV light.

6. The method of claim 3, wherein the mask comprises a microfluidic reagent well caddie, a semiconductor chip, a reflective/refractive surface, or cladding on an optic fiber.

7. The method of claim 1, wherein the resin exclusion region comprises an end of a optic fiber or capillary tube.

8. The method of claim 1, wherein the substrate comprises a microfluidic chip or a semiconductor pad.

9. The method of claim 1, wherein the resin flow comprises capillary action.

10. The method of claim 1, further comprising conducting electricity through the resin.

11. The method of claim 1, further comprising final curing the resin with light or heat.

12. The method of claim 11, wherein the substrate comprises quartz glass.

* * * * *